(12) United States Patent
Park et al.

(10) Patent No.: US 11,690,281 B2
(45) Date of Patent: Jun. 27, 2023

(54) DISPLAY APPARATUS

(71) Applicant: SAMSUNG DISPLAY CO., LTD., Yongin-si (KR)

(72) Inventors: Soon-Sung Park, Asan-si (KR); Seongsik Ahn, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/689,340

(22) Filed: Mar. 8, 2022

(65) Prior Publication Data

US 2022/0190265 A1 Jun. 16, 2022

Related U.S. Application Data

(63) Continuation of application No. 17/037,856, filed on Sep. 30, 2020, now Pat. No. 11,296,288, which is a
(Continued)

(30) Foreign Application Priority Data

Dec. 28, 2017 (KR) .................. 10-2017-0183055

(51) Int. Cl.
| | |
|---|---|
| *H01L 51/00* | (2006.01) |
| *H01L 51/52* | (2006.01) |
| *H01L 51/56* | (2006.01) |
| *G09G 3/3291* | (2016.01) |
| *H01L 27/32* | (2006.01) |
| *G09G 3/3266* | (2016.01) |

(Continued)

(52) U.S. Cl.
CPC ......... *H10K 77/111* (2023.02); *G09G 3/3266* (2013.01); *G09G 3/3291* (2013.01); *H10K 50/8445* (2023.02); *H10K 59/1213* (2023.02); *H10K 59/131* (2023.02); *H10K 59/40* (2023.02); *H10K 71/00* (2023.02); *H10K 2102/311* (2023.02)

(58) Field of Classification Search
CPC ............ H01L 27/3262; H01L 51/5256; H01L 27/323; H01L 51/0097; H01L 27/3276; H01L 51/56; H01L 2251/5338; G09G 3/3266; G09G 3/3291; G09G 2300/0842; G09G 2300/0861
See application file for complete search history.

(56) References Cited

U.S. PATENT DOCUMENTS

| | | | |
|---|---|---|---|
| 9,048,443 | B2 | 6/2015 | Namkung et al. |
| 9,196,848 | B2 | 11/2015 | Namkung et al. |

(Continued)

FOREIGN PATENT DOCUMENTS

| | | |
|---|---|---|
| CN | 105826350 | 8/2016 |
| CN | 105938405 | 9/2016 |

(Continued)

*Primary Examiner* — Deeprose Subedi
(74) *Attorney, Agent, or Firm* — F. Chau & Associates, LLC

(57) ABSTRACT

A display apparatus includes a substrate including a first area, a second area, and a bending area between the first area and the second area, a plurality of pixels disposed in the first area, a protection film disposed under the substrate, a dummy film disposed under the protection film, and an opening in the protection film, wherein the opening overlaps the bending area.

21 Claims, 10 Drawing Sheets

Related U.S. Application Data continuation of application No. 16/217,341, filed on Dec. 12, 2018, now Pat. No. 10,811,623.

(51) Int. Cl.
*H10K 77/10* (2023.01)
*H10K 50/844* (2023.01)
*H10K 59/40* (2023.01)
*H10K 59/131* (2023.01)
*H10K 59/121* (2023.01)
*H10K 71/00* (2023.01)
*H10K 102/00* (2023.01)

(56) References Cited

U.S. PATENT DOCUMENTS

| | | | |
|---|---|---|---|
| 9,214,640 B2 | 12/2015 | Lee et al. |
| 9,324,959 B2 | 4/2016 | Namkung et al. |
| 9,419,065 B2 | 8/2016 | Degner et al. |
| 9,490,312 B2 | 11/2016 | Lee et al. |
| 9,766,737 B2 | 9/2017 | Ahn |
| 9,798,414 B2 | 10/2017 | Kim et al. |
| 9,939,846 B2 | 4/2018 | Namkung et al. |
| 9,983,424 B2 | 5/2018 | Kim et al. |
| 9,985,228 B2 | 5/2018 | Tsuruoka et al. |
| 10,141,540 B2 | 11/2018 | Sung et al. |
| 10,186,684 B2 | 1/2019 | Chun |
| 10,270,059 B2 | 4/2019 | Kim |
| 10,446,769 B2 | 10/2019 | Kim et al. |
| 10,454,047 B2 | 10/2019 | Kim |
| 10,483,098 B2 | 11/2019 | Um et al. |
| 10,811,623 B2 | 10/2020 | Park et al. |
| 11,026,323 B2 | 6/2021 | Shi et al. |
| 2016/0307973 A1 | 10/2016 | Yang et al. |
| 2017/0042047 A1 | 2/2017 | Oh |
| 2017/0062742 A1 | 3/2017 | Kim |
| 2018/0090701 A1* | 3/2018 | Senda ............ H01L 51/5253 |
| 2018/0192527 A1* | 7/2018 | Yun ............ G06F 1/1681 |
| 2019/0207133 A1 | 7/2019 | Park et al. |
| 2021/0028379 A1 | 1/2021 | Park et al. |

FOREIGN PATENT DOCUMENTS

| | | |
|---|---|---|
| CN | 106205394 | 12/2016 |
| CN | 106252378 | 12/2016 |
| CN | 106340523 | 1/2017 |
| CN | 106486520 | 3/2017 |
| CN | 106856206 | 6/2017 |
| CN | 106910430 | 6/2017 |
| CN | 107067977 | 8/2017 |
| CN | 107112348 | 8/2017 |
| CN | 206400960 | 8/2017 |
| CN | 107180849 | 9/2017 |
| CN | 107305906 | 10/2017 |
| CN | 107342373 | 11/2017 |
| CN | 107492561 | 12/2017 |
| JP | 2003-243778 | 8/2003 |
| KR | 10-2014-0085956 | 7/2014 |
| KR | 10-2014-0136762 | 12/2014 |
| KR | 10-2015-0007632 | 1/2015 |
| KR | 10-2015-0094989 | 8/2015 |
| KR | 10-2016-0111839 | 9/2016 |
| KR | 10-2017-0125161 | 11/2017 |

* cited by examiner

DISPLAY APPARATUS

CROSS-REFERENCE TO RELATED APPLICATIONS

This U.S. non-provisional patent application is a continuation of U.S. patent application Ser. No. 17/037,856 filed on Sep. 30, 2020, which is a continuation of U.S. patent application Ser. No. 16/217,341 filed on Dec. 12, 2018, now U.S. Pat. No. 10,811,623 issued on Oct. 20, 2020, which claims priority under 35 U.S.C. § 119 to Korean Patent Application No. 10-2017-0183055, filed on Dec. 28, 2017, the disclosures of which are incorporated by reference herein in their entireties.

1. TECHNICAL FIELD

The inventive concept relates to a display apparatus, and more particularly, to a display apparatus having a strong bending area in its display panel.

2. DESCRIPTION OF THE RELATED ART

In recent years, display apparatuses having a flexible display panel have been developed. The display panel includes a plurality of pixels to display an image and a driving chip to drive the pixels. The pixels are disposed in a display area of the display panel, and the driving chip is disposed in a non-display area of the display panel. For example, the non-display area may surround the display area. A bending area is provided between the driving chip and the display area, such that when the bending area is bent, the driving chip can be disposed under the display panel.

A protection film is disposed under the display panel to protect a lower portion of the display panel. A portion of the protection film overlapping the bending area may be removed to reduce a thickness of the bending area. As a result, the bending area can be more easily bent. However, when the protection film is not disposed in the bending area, the bending area is vulnerable to an external impact.

SUMMARY

Exemplary embodiments of the inventive concept provide a display apparatus including a substrate including a first area, a second area, and a bending area between the first area and the second area, a plurality of pixels disposed in the first area, a protection film disposed under the substrate, a dummy film disposed under the protection film, and an opening in the protection film, wherein the opening overlaps the bending area.

The protection film has the same thickness as the dummy film.

A thickness of each of the protection film and the dummy film ranges from about 20 micrometers ($\mu$m) to about 50 micrometers ($\mu$m).

The substrate has a thickness smaller than a thickness of each of the protection film and the dummy film.

The protection film and the dummy film include the same material, and each of the substrate, the protection film, and the dummy film is flexible.

The second area is disposed under the first area when the bending area is bent.

The first area includes a display area in which the pixels are disposed and a non-display area adjacent to the display area.

The display apparatus further includes: a thin film encapsulation layer disposed in the display area and a portion of the non-display area to cover the pixels; a touch sensing unit disposed on the thin film encapsulation layer; and a window disposed on the touch sensing unit.

The display apparatus further includes: a scan driver disposed in the non-display area and connected to the pixels through a plurality of scan lines; an emission driver disposed in the non-display area and connected to the pixels through a plurality of emission lines; and a data driver disposed in the second area and connected to the pixels through a plurality of data lines.

The bending area extends in a first direction, and the first area, the second area, and the bending area are arranged in a second direction crossing the first direction.

The display apparatus further includes a plurality of support units disposed on a portion of the dummy film overlapping the opening.

Each of the support units has a thickness smaller than a thickness of the protection film.

The support units are disposed on the dummy film in a single layer and contact each other.

The support units are disposed on the dummy film in a single layer and are spaced apart from each other.

The display apparatus further includes a plurality of support units disposed under a portion of the dummy film overlapping the opening.

The display apparatus further includes a support member disposed under a portion of the dummy film overlapping the opening.

A plurality of slits is provided in an upper surface of the support member, and a lower surface of the support member has a convex curved surface projected away from the upper surface of the support member.

The display apparatus further includes a sub-protection film disposed under the dummy film, a sub-dummy film disposed under the sub-protection film, and a sub-opening in the sub-protection film, wherein the sub-opening overlaps the bending area.

Exemplary embodiments of the inventive concept provide a display apparatus including a substrate including a first area, a second area, and a bending area between the first area and the second area, a plurality of pixels disposed in the first area, a protection film disposed under the substrate, a dummy film disposed under the protection film, and a plurality of first sub-openings in the protection film, wherein the first sub-openings overlap the bending area.

The bending area and the first sub-openings extend in a first direction, and the first area, the second area, and the bending area are arranged in a second direction crossing the first direction.

The display apparatus further includes: a sub-protection film disposed under the dummy film; a sub-dummy film disposed under the sub-protection film; and a plurality of second sub-openings in the sub-protection film, wherein the second sub-openings overlap the bending area.

The second sub-openings overlap with the first sub-openings.

The second sub-openings do not overlap with the first sub-openings.

Exemplary embodiments of the inventive concept provide a display apparatus including a substrate including a first area, a second area, and a bending area between the first area and the second area, a plurality of pixels disposed in the first area, a protection film disposed under the substrate and including an opening that overlaps the bending area, and a plurality of dummy films disposed under a portion of the substrate overlapping the opening.

A total thickness of the dummy films is less than a thickness of the protection film.

The protection film has a thickness of about 100 micrometers (μm), and each of the dummy films has a thickness ranging from about 20 (pn) micrometers to about 30 micrometers (μm).

Exemplary embodiments of the inventive concept provide a display apparatus including: a substrate including a display area, a non-display area and a bending area; a pixel layer disposed on a first side of the substrate in the display area; a protection film disposed on a second side of the substrate, the protection film including an opening in the bending area; and a dummy film disposed on the protection film.

The display apparatus further includes: a thin film encapsulation layer disposed on the pixel layer; a touch sensing unit disposed on the thin film encapsulation layer; and a window disposed on the touch sensing unit.

The display apparatus further includes a data driver disposed on the first side of the substrate in the non-display area.

The data driver may be disposed under the window when the bending area is bent.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, exemplary embodiments of the inventive concept will be explained in detail with reference to the accompanying drawings. However, the inventive concept may be embodied in many different forms, and should not be construed as being limited to the embodiments set forth herein. Like numbers may refer to like elements throughout the specification.

It will be understood that when an element or layer is referred to as being "on", "connected to" or "coupled to" another element or layer, it can be directly on, connected or coupled to the other element or layer or intervening elements or layers may be present.

Embodiments of the inventive concept in this disclosure are described with reference to plan views and cross-sectional views that are ideal schematic diagrams. Accordingly, shapes of the views may vary depending on manufacturing technologies and/or tolerances. Thus, the embodiments are not limited to shown specific forms and also include variations in form produced according to manufacturing processes.

Figure 1:
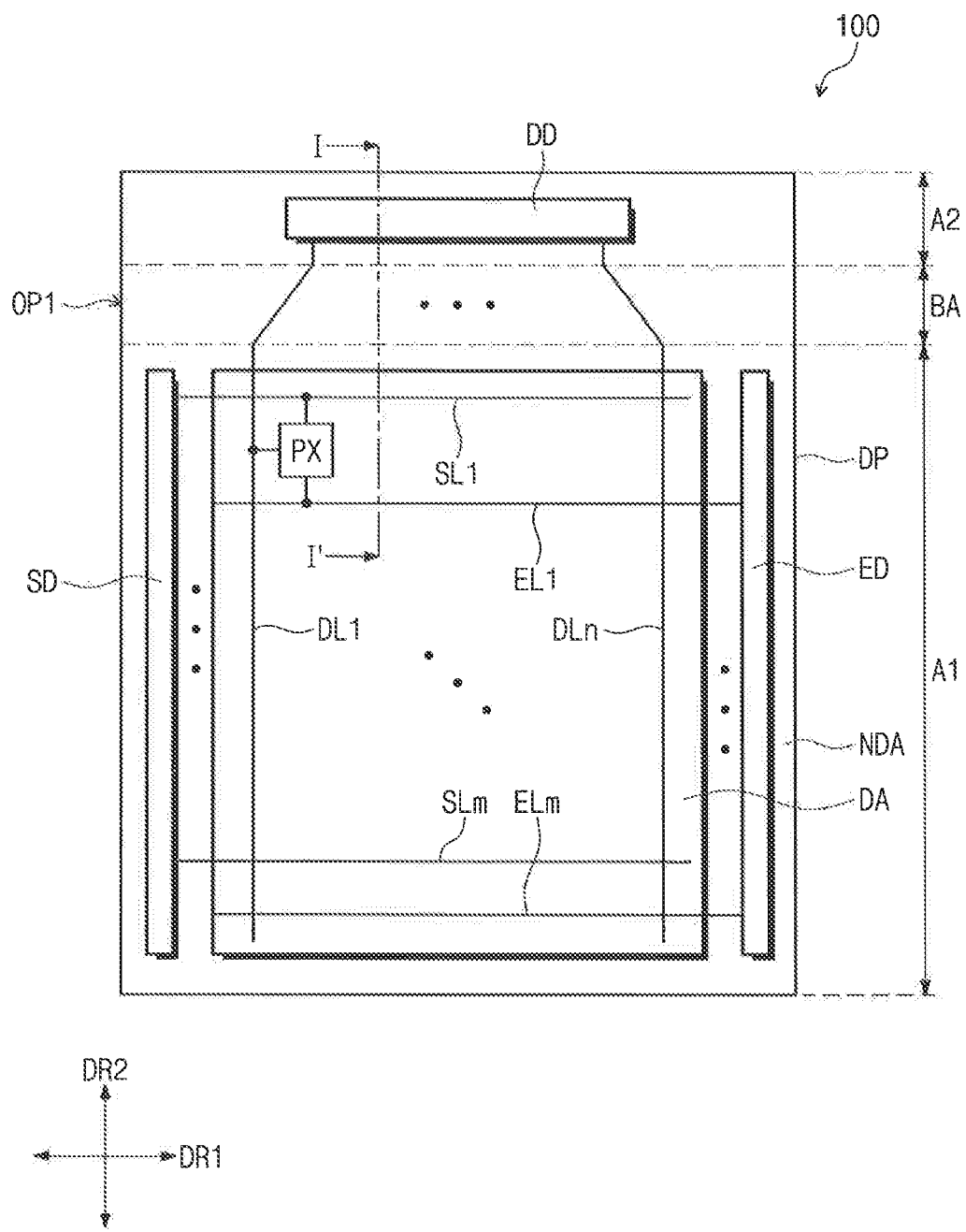
FIG. 1 is a plan view illustrating a display apparatus according to an exemplary embodiment of the inventive concept.

FIG. 1 is a plan view illustrating a display apparatus 100 according to an exemplary embodiment of the inventive concept.

Referring to FIG. 1, the display apparatus 100 according to the present embodiment may include a display panel DP, a scan driver SD, a data driver DD, and an emission driver ED. The display panel DP may be an organic light emitting display panel, but the inventive concept is not limited thereto. For example, various display panels such as a liquid crystal display panel, an electrowetting display panel, and an electrophoretic display panel may be used as the display panel DP.

The display panel DP may be a flexible display panel. For example, the display panel DP may include a substrate formed of a plastic material having flexibility and a plurality of electronic elements disposed on the substrate. The display panel DP may have a rectangular shape which has short sides parallel to a first direction DR1 and long sides parallel to a second direction DR2 crossing the first direction DR1. The second direction DR2 may be substantially perpendicular to the first direction DR1.

The scan driver SD, the data driver DD, and the emission driver ED may be referred to as a driving part to drive the display panel DP. The scan driver SD, the data driver DD and the emission driver ED may provide driving signals to the display panel DP to drive the display panel DP. The display panel DP may generate an image in response to the driving signals.

The display panel DP may have a flat surface (or a plane) parallel to a plane defined by the first direction DR1 and the second direction DR2. The flat surface of the display panel DP may include a first area A1, a second area A2, and a bending area BA between the first area A1 and the second area A2. The bending area BA may extend in the first direction DR1, and the first area A1, the bending area BA, and the second area A2 may be arranged in the second direction DR2.

The first area A1 may include a display area DA and a non-display area NDA surrounding the display area DA. In an alternative embodiment, the non-display area NDA may only be disposed on one, two or three sides of the display area DA, and may not completely surround the display area DA. The display area DA corresponds to an area in which an image is displayed and the non-display area NDA corresponds to an area in which no image is displayed. The second area A2 and the bending area BA correspond areas in which no image is displayed. An area which does not display the image may be a "bezel area".

The display panel DP may include a plurality of pixels PX, a plurality of scan lines SL1 to SLm, a plurality of data lines DL1 to DLn, and a plurality of emission lines EL1 to ELm. Each of "m" and "n" is a natural number. For the convenience of explanation, FIG. 1 shows one pixel PX. The pixels PX may be arranged in a matrix form in the display area DA and may be connected to the scan lines SL1 to SLm, the data lines DL1 to DLn, and the emission lines EL1 to ELm.

The scan driver SD and the emission driver ED may be disposed in the non-display area NDA and face each other with the display area DA disposed therebetween. The data driver DD may be disposed in the second area A2, and the scan driver SD and the emission driver ED may be disposed in the first area A1. The scan driver SD may be disposed in the non-display area NDA adjacent to one side of the display panel DP. For example, the scan driver SD may be adjacent to a first long side of the display panel DP. The emission driver ED may be disposed in the non-display area NDA adjacent to a second long side of the display panel DP opposite to the first long side of the display panel DP. The data driver DD may be an integrated circuit chip and may be mounted on the second area A2.

The scan lines SL1 to SLm may extend in the first direction DR1 and may be connected to the scan driver SD. The scan lines SL1 to SLm may receive a plurality of scan signals from the scan driver SD. The data lines DL1 to DLn may extend in the second direction DR2 and may be connected to the data driver DD. The data lines DL to DLn may receive a plurality of data voltages from the data driver DD. The emission lines EL1 to ELm may extend in the first direction DR1 and may be connected to the emission driver ED. The emission lines EL1 to ELm may receive a plurality of emission signals from the emission driver ED.

The scan driver SD may generate the scan signals, and the scan signals may be applied to the pixels PX through the scan lines SL1 to SLm. The scan signals may be applied sequentially to the pixels PX. The data driver DD may generate the data voltages, and the data voltages may be applied to the pixels PX through the data lines DL1 to DLn. The emission driver ED may generate the emission signals, and the emission signals may be applied to the pixels PX through the emission lines EL1 to ELm.

The display apparatus 100 may include a timing controller to control operations of the scan driver SD, the data driver DD, and the emission driver ED. The timing controller may generate a scan control signal, a data control signal, and an emission control signal in response to control signals provided from an external source. For example, the control signals may be provided from a host device. Additionally, the timing controller may receive image signals from the external source and may convert a data format of the image signals to a data format appropriate to an interface between the data driver DD and the timing controller. For example, the image signals may be provided from the host device. The timing controller may provide the image signals having the converted data format to the data driver DD.

The scan driver SD may generate the scan signals in response to the scan control signal, and the emission driver ED may generate the emission signals in response to the emission control signal. The data driver DD may receive the image signals having the converted data format and may generate the data voltages corresponding to the image signals having the converted data format in response to the data control signal.

The pixels PX may receive the data voltages in response to the scan signals. The pixels PX may emit light having brightness corresponding to the data voltages in response to the emission signals. Therefore, an image may be displayed. A light emitting time of the pixels PX may be controlled by the emission signals.

An opening portion OP1 may be provided in a lower portion of the display panel DP in the bending area BA. For example, the bending area BA may be bent to allow the second area A2 to be disposed under the first area A1. The opening portion OP1 and the bending structure of the bending area BA will be described in more detail below.

Figure 2:
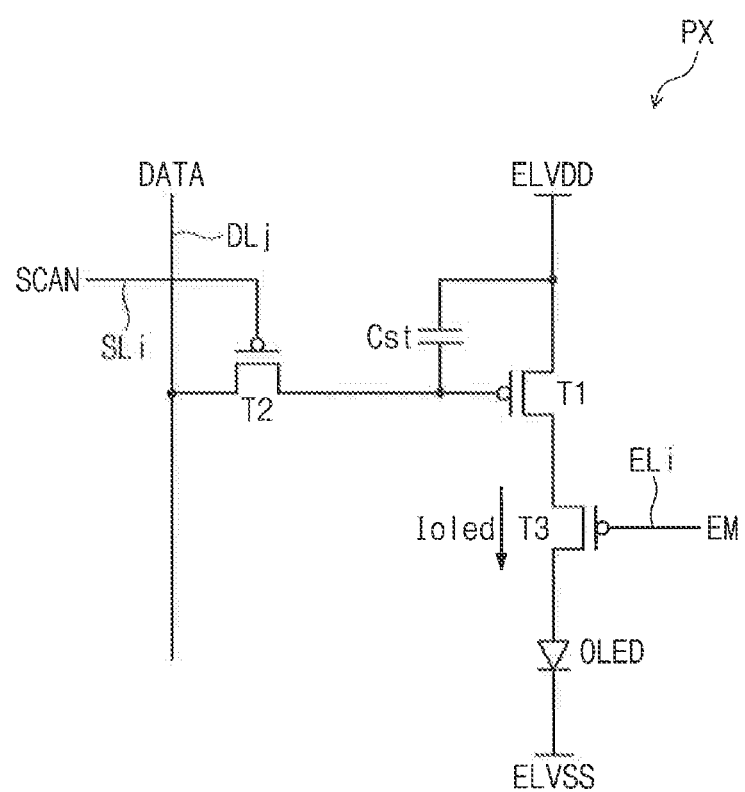
FIG. 2 is an equivalent circuit diagram showing a pixel illustrated in FIG. 1, according to an exemplary embodiment of the inventive concept.

FIG. 2 is an equivalent circuit diagram showing the pixel PX illustrated in FIG. 1, according to an exemplary embodiment of the inventive concept.

FIG. 2 shows only one pixel PX, however, the other pixels PX disposed in the display panel DP may have the same configuration as that of the pixel PX illustrated in FIG. 2.

Referring to FIG. 2, the pixel PX may be connected to a corresponding scan line SLi of the scan lines SL1 to SLm, a corresponding data line DLj of the data lines DL1 to DLn, and a corresponding emission line ELi of the emission lines EL1 to ELm. "i" is a natural number equal to or less than "m", and "j" is a natural number equal to or less than "n". The pixel PX may include an organic light emitting element OLED, a driving transistor T1, a capacitive element Cst, a switching transistor T2, and an emission control transistor T3. The organic light emitting element OLED may be, for example, an organic light emitting diode. The capacitive element Cst may be, for example, a storage capacitor.

A source terminal of the driving transistor T1 may be applied with a first voltage ELVDD, and a drain terminal of the driving transistor T1 may be connected to a source terminal of the emission control transistor T3. A gate terminal of the driving transistor T1 may be connected to a drain terminal of the switching transistor T2.

A gate terminal of the switching transistor T2 may be connected to the scan line SLi, and a source terminal of the switching transistor T2 may be connected to the data line DLj. A first electrode of the capacitive element Cst may be connected to the source terminal of the driving transistor T1, and a second electrode of the capacitive element Cst may be connected to the gate terminal of the driving transistor T1. The second electrode of capacitive element Cst may also be connected to the drain of the switching transistor T2.

A gate terminal of the emission control transistor T3 may be connected to the emission line ELi, and a drain terminal of the emission control transistor T3 may be connected to an anode of the organic light emitting element OLED. A cathode of the organic light emitting element OLED may be applied with a second voltage ELVSS. A level of the second voltage ELVSS may be lower than a level of the first voltage ELVDD.

The switching transistor T2 may be turned on in response to a scan signal SCAN provided through the scan line SLi. The turned-on switching transistor T2 may provide a data voltage DATA, which is provided through the data line DLj, to the gate terminal of the driving transistor T1. The capacitive element Cst may be charged with the data voltage DATA applied to the gate terminal of the driving transistor T1 and may maintain the charged data voltage DATA after the switching transistor T2 is turned off.

The gate terminal of the emission control transistor T3 may receive an emission signal EM through the emission line ELi, and the emission control transistor T3 may be turned on in response to the emission signal EM. The turned-on emission control transistor T3 may provide a current Ioled, which flows through the driving transistor T1, to the organic light emitting element OLED. The pixel PX may emit light while the emission signal EM is applied to the emission control transistor T3. An intensity of the light emitted from the organic light emitting element OLED may be changed depending on the amount of the current Ioled.

In an exemplary embodiment of the inventive concept, the transistors T1, T2 and T3 of the pixel PX are PMOS transistors, but they are not be limited thereto. For example, the transistors T1, T2 and T3 of the pixel PX may be NMOS transistors.

Figure 3:
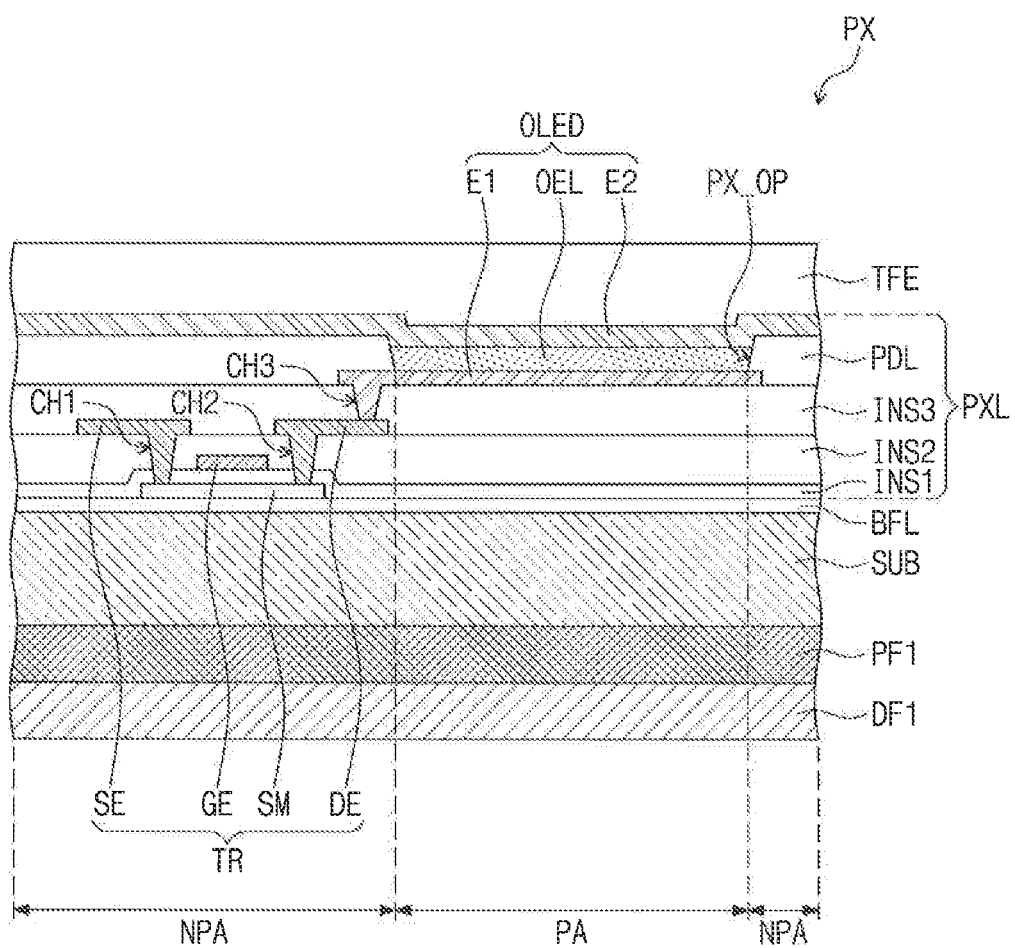
FIG. 3 is a cross-sectional view showing the pixel illustrated in FIG. 2, according to an exemplary embodiment of the inventive concept.

FIG. 3 is a cross-sectional view showing the pixel PX illustrated in FIG. 2, according to an exemplary embodiment of the inventive concept.

Referring to FIG. 3, the pixel PX may include an organic light emitting element OLED and a transistor TR connected to the organic light emitting element OLED. The transistor TR may be the emission control transistor T3. The transistor TR and the organic light emitting element OLED may be disposed on a substrate SUB. A layer including the transistor TR and the organic light emitting element OLED may be a pixel layer PXL.

The substrate SUB may include a transparent flexible substrate made of a plastic having flexibility. For example, the substrate SUB may include a polyimide (PI) as the plastic having flexibility. A buffer layer BFL may be disposed on the substrate SUB and may include an inorganic material.

A protection film PF1 having flexibility may be disposed under the substrate SUB. A dummy film DF1 having flexibility may be disposed under the protection film PF1. The protection film PF1 and the dummy film DF1 may include the same material.

Each of the protection film PF1 and the dummy film DF1 may include a polyimide (PI) or a polyethylene terephthalate (PET) as a plastic having the flexibility. However, the inventive concept is not limited thereto, and the protection film PF1 and the dummy film DF1 may include materials different from each other as long as the protection film PF1 and the dummy film DF1 have flexibility.

A semiconductor layer SM of the transistor TR may be disposed on the buffer layer BFL. The semiconductor layer SM may include an inorganic semiconductor such as amorphous silicon or poly-silicon or may include an organic semiconductor. Alternatively, the semiconductor layer SM may include an oxide semiconductor. The semiconductor layer SM may include a source region, a drain region, and a channel region between the source region and the drain region.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 and may overlap with the semiconductor layer SM. The gate electrode GE may overlap with the channel region of the semiconductor layer SM.

A second insulating layer INS2 may be disposed on the first insulating layer INS1 to cover the gate electrode GE. The second insulating layer INS2 may be an interlayer insulating layer. The second insulating layer INS2 may include an organic material and/or an inorganic material.

A source electrode SE and a drain electrode DE of the transistor TR may be spaced apart from each other and may be disposed on the second insulating layer INS2. The source electrode SE may be connected to the source region of the semiconductor layer SM through a first contact hole CH1 provided through the first and second insulating layers INS1 and INS2. The drain electrode DE may be connected to the drain region of the semiconductor layer SM through a second contact hole CH2 provided through the first and second insulating layers INS1 and INS2.

A third insulating layer INS3 may be disposed on the second insulating layer INS2 and cover the source electrode SE and the drain electrode DE of the transistor TR. The third insulating layer INS3 may be a planarization layer and provide a flat upper surface. The third insulating layer INS3 may include an organic material.

A first electrode E1 of the organic light emitting element OLED may be disposed on the third insulating layer INS3. The first electrode E1 may be connected to the drain electrode DE of the transistor TR through a third contact hole CH3 provided through the third insulating layer INS3. The first electrode E1 may be a pixel electrode or an anode electrode. The first electrode E1 may include a transparent electrode or a reflective electrode.

A pixel defining layer PDL may be disposed on the first electrode E1 and the third insulating layer INS3 to expose a portion of the first electrode E1. A pixel opening portion PX_OP may be provided in the pixel defining layer PDL to expose the portion of the first electrode E1. An area in which the pixel opening portion PX_OP is provided may be a "pixel area PA". A periphery of the pixel area PA may be a "non-pixel area NPA". For example, the non-pixel area NPA may be disposed at opposite sides of the pixel area PA.

An organic light emitting layer OEL may be disposed on the first electrode E1 in the pixel opening portion PX_OP. The organic light emitting layer OEL may include an organic material capable of generating a light having one of a red color, a green color, and a blue color. Therefore, the organic light emitting layer OEL may generate one of red, green, and blue lights. However, the inventive concept not be limited thereto, and the organic light emitting layer OEL may generate a white light by a combination of organic materials respectively generating red light, green light, and blue light.

The organic light emitting layer OEL may include a low-molecular organic material or a high-molecular organic material. The organic light emitting layer OEL may be formed of a multi-layer structure of a hole injection layer (HIL), a hole transporting layer (HTL), a light emitting layer (EML), an electron transporting layer (ETL), and an electron injection layer (EIL). The hole injection layer may be disposed on the first electrode E1. The hole transporting layer (HTL), the light emitting layer (EML), the electron transporting layer (ETL), and the electron injection layer (EIL) may be sequentially stacked on the hole injection layer (HIL).

A second electrode E2 of the organic light emitting element OLED may be disposed on the pixel defining layer PDL and the organic light emitting layer OEL. The second electrode E2 may be a common electrode or a cathode electrode. The second electrode E2 may include a transparent electrode or a reflective electrode.

When the display panel DP is a front emission type organic light emitting display panel, the first electrode E1 may be the reflective electrode and the second electrode E2 may be the transparent electrode. When the display panel DP is a rear emission type organic light emitting display panel, the first electrode E1 may be the transparent electrode and the second electrode E2 may be the reflective electrode.

The organic light emitting element OLED may be disposed in the pixel area PA and may include the first electrode E1, the organic light emitting layer OEL, and the second electrode E2 in the pixel area PA. The first electrode E1 may be an anode to inject holes, and the second electrode E2 may be a cathode to inject electrons. The pixel defining layer PDL and elements disposed thereunder may be provided in the non-pixel area NPA.

A thin film encapsulation layer TFE may be disposed on the organic light emitting element OLED to cover the pixel PX. For example, the thin film encapsulation layer TFE may be disposed on the second electrode E2. The thin film encapsulation layer TFE may include an organic material and/or an inorganic material.

The first voltage ELVDD may be applied to the first electrode E1 through the transistor TR. Holes and electrons injected in the organic light emitting layer OEL may be combined with each other to generate excitons (e.g., electron-hole pairs), and the excitons may transition from an excited state to a ground state to emit a light from the organic light emitting element OLED. The organic light emitting element OLED may emit one of the red, green, and blue lights according to a flow of a current, and thus, image information may be displayed.

Figure 4:
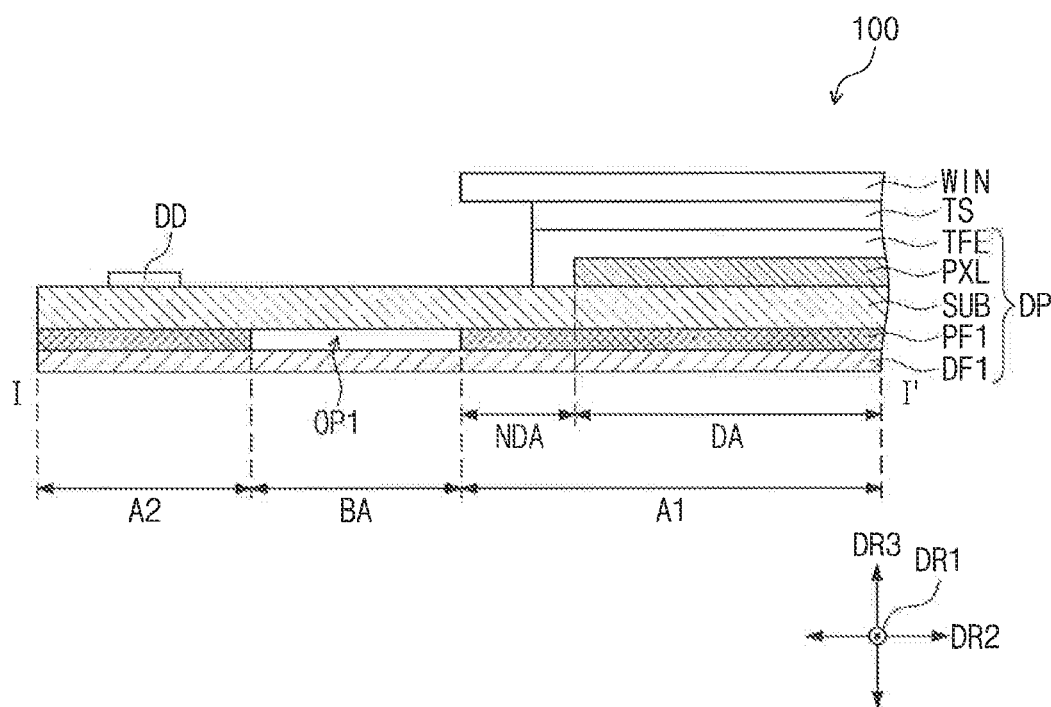
FIG. 4 is a cross-sectional view taken along a line I-I' illustrated in FIG. 1, according to an exemplary embodiment of the inventive concept.
Figure 5:
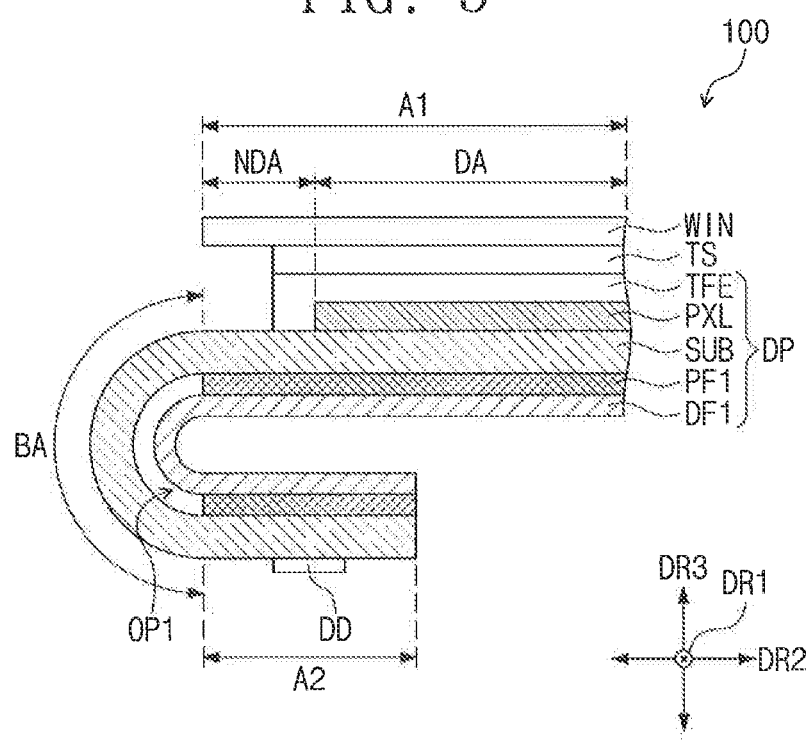
FIG. 5 is a view showing a bending state of a bending area illustrated in FIG. 4, according to an exemplary embodiment of the inventive concept.

FIG. 4 is a cross-sectional view taken along a line I-I' illustrated in FIG. 1, according to an exemplary embodiment of the inventive concept. FIG. 5 is a cross-sectional view showing a bending state of a bending area illustrated in FIG. 4, according to an exemplary embodiment of the inventive concept.

For the convenience of explanation, the buffer layer BFL disposed on the substrate SUB is omitted in FIG. 4 and FIG. 5.

Referring to FIG. 4 and FIG. 5, the display panel DP may include the substrate SUB, the pixel layer PXL, the thin film encapsulation layer TFE, the protection film PF1, and the dummy film DF1. The substrate SUB may include the first area A1, the second area A2, and the bending area BA like the display panel DP shown in FIG. 1.

The pixel layer PX L may be disposed on the substrate SUB of the display area DA, and the thin film encapsulation layer TFE may be disposed on the substrate SUB to cover the pixel layer PXL. The thin film encapsulation layer TFE may be disposed on the pixel layer PXL in the display area DA. The thin film encapsulation layer TFE may be disposed on the substrate SUB in a portion of the non-display NDA adjacent to the display area DA. For example, the thin film encapsulation layer TFE is disposed on an upper surface of the pixel layer PXL in the display area DA, and a side surface of the pixel layer PXL in the non-display area NDA. The data driver DD may be disposed on the substrate SUB in the second area A2.

The display apparatus 100 may include a touch sensing unit TS disposed on the thin film encapsulation layer TFE and a window WIN disposed on the touch sensing unit TS. The touch sensing unit TS may sense an external input (e.g., a finger of a user or a touch pen), may convert the sensed input into an input signal, and may provide the input signal to the display panel DP. The touch sensing unit TS may sense the external input in a capacitive manner. The display panel DP may receive the input signal from the touch sensing unit TS and may generate an image corresponding to the input signal. In other words, the display apparatus 100 may include a capacitive touch screen.

The image generated by the display panel DP may be provided to the user after sequentially passing through the touch sensing unit TS and the window WIN. The window WIN may be an upper surface of the display apparatus 100 and may protect the display panel DP and the touch sensing unit TS from an external force.

The protection film PF1 may be disposed under the substrate SUB, and the dummy film DF1 may be disposed under the protection film PF1. The protection film PF1 may have the same thickness as that of the dummy film DF1. In an exemplary embodiment of the inventive concept, the thickness of each of the protection film PF1 and the dummy film DF1 may range from about 20 micrometers (μm) to about 50 micrometers (μm). However, the inventive concept is not limited thereto, and the protection film PF1 and the dummy film DF1 may have different thicknesses from each other. The substrate SUB may have a thickness less than that of each of the protection film PF1 and the dummy film DF1. For instance, the substrate SUB may have a thickness of about 10 micrometers (μm).

A direction that is substantially perpendicular to a flat surface defined by the first and second directions DR1 and DR2 may be a "third direction DR3". The thickness of each of the substrate SUB, the protection film PF1, and the dummy film DF1 may correspond to a distance between an upper surface and a lower surface of each of the substrate SUB, the protection film PF1, and the dummy film DF1 in the third direction DR3. For example, the thickness of the substrate SUB may be a distance between its upper and lower surfaces in the third direction DR3.

The opening portion OP may be provided in a portion of the protection film PF1 overlapping the bending area BA. The opening portion OP1 may extend in the first direction DR1 in the bending area BA. The protection film PF1 overlapping the bending area BA may be removed to form the opening portion OP1. In other words, the protection film PF1 is not disposed in the opening portion OP1.

The dummy film DF1 may be disposed under the protection film PF1 to cover the opening portion OP1. The dummy film DF1 may extend from the first area A1 to the bending area BA to the second area A2. Since the dummy film DF1, which has a flat shape, is disposed under the opening portion OP1, a lower portion of the opening portion OP1 may be closed. In other words, the lower portion of the opening portion OP1 may be covered by the dummy film DF1. However, both ends of the opening portion OP1 in the first direction DR1 may be opened.

Since each of the substrate SUB, the protection film PF1, and the dummy film DF1 are flexible, the bending area BA may be easily bent as shown in FIG. 5. Since the substrate SUB and the dummy film DF1 are bent in the bending area BA, the second area A2 may be disposed under the first area A1. Therefore, the data driver DD may be disposed under the first area A1.

Since the bending area BA is bent to allow the second area A2 to be disposed under the substrate SUB of the first area A1, the second area A2, which is the bezel area, may not be exposed to an outside when the display apparatus 100 is viewed from above the display apparatus 100. Therefore, the bezel area may be reduced.

In a case that the dummy film DF1 is not disposed in the display apparatus 100, a groove may be provided in the bending area BA when the portion of the protection film PF1 overlapping the bending area BA is removed. In this case, only the substrate SUB is disposed in the bending area BA, and the substrate SUB can be bent to allow the second area A2 to be disposed under the first area A1. Since only the substrate SUB is disposed in the bending area BA, the substrate SUB of the bending area BA may be damaged by an external impact.

In contrast, in the present embodiment, the dummy film DF1 may be disposed under the protection film PF1 in the opening portion OP1 in the bending area BA. Since the substrate SUB and the dummy film DF1 are disposed in the bending area BA, the bending area BA may be strengthened. Therefore, a resistance of the bending area BA to an external impact may increase. Additionally, the external impact applied to the bending area BA may be absorbed by the opening portion OP1 in the bending area BA.

Consequently, the display apparatus 100 according to the present embodiment has a structure that strengthens the bending area BA and absorbs external impacts applied to the bending area BA, thereby preventing the bending area BA from being damaged.

FIGS. 6 to 16 are views showing configurations of bending areas of display apparatuses according to various exemplary embodiments of the inventive concept.

Each of the display apparatuses according to the various exemplary embodiments of the inventive concept may have the same configuration as that of the display apparatus 100 shown in FIG. 1 except for their bending areas BA. Accordingly, differences between the bending areas BA shown in FIGS. 6 to 16 from those of the bending area BA shown in FIG. 4 will be mainly described.

Figure 6:
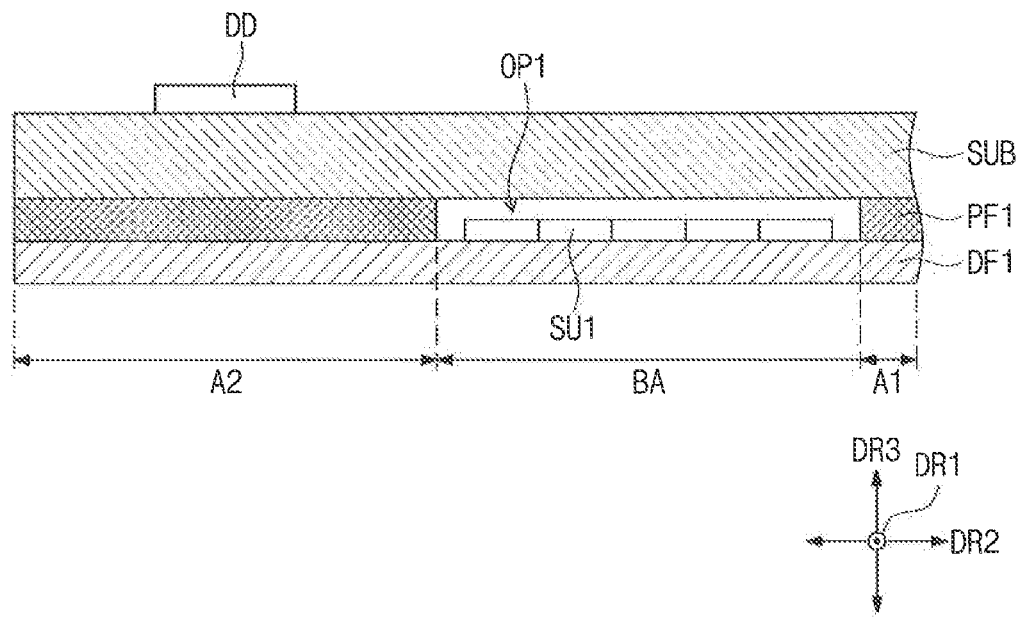
FIGS. 6, 7, 8, 9, 10, 11, 12, 13, 14, 15 and 16 are views showing configurations of bending areas of display apparatuses according to exemplary embodiments of the inventive concept.
Figure 7:
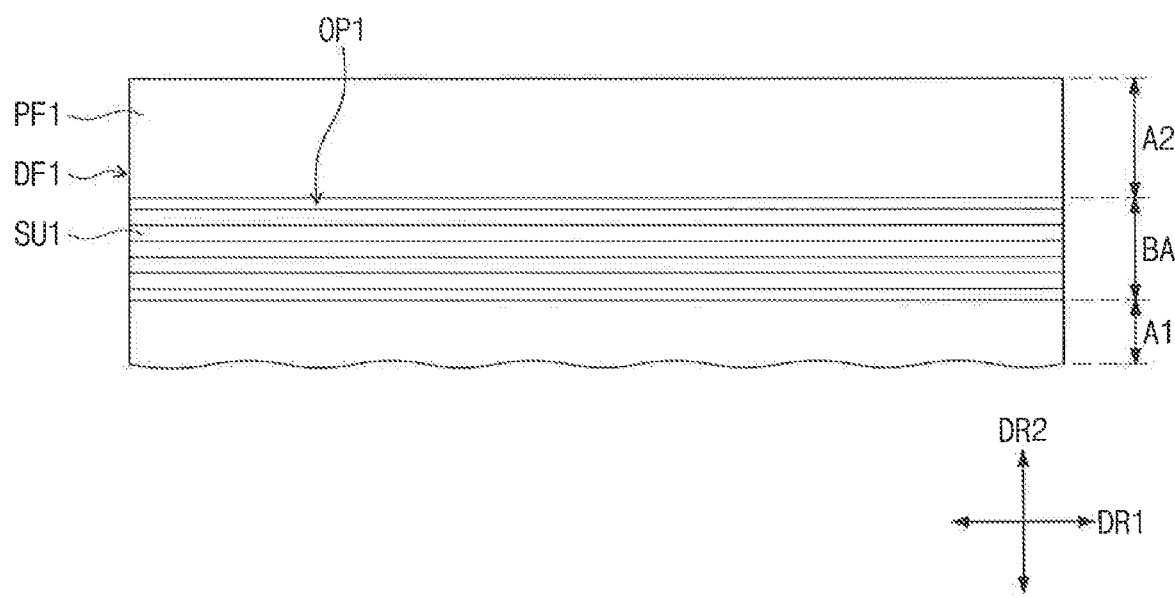

For convenience of explanation, in FIGS. 6 to 16, the bending areas BA are enlarged, and the second area A2 and a portion of the first area A1 adjacent to each of the bending areas BA are illustrated. FIG. 7 is a plan view showing support units SU1 illustrated in FIG. 6, according to an exemplary embodiment of the inventive concept. For convenience of explanation, only the protection film PF1 and the support units SU1 disposed on the dummy film DF1 are illustrated in FIG. 7.

Referring to FIG. 6 and FIG. 7, the opening portion OP1 may be located in the portion of the protection film PF1 overlapping the bending area BA, and the plurality of support units SU1 may be disposed on a portion of the dummy film DF1 overlapping the opening portion OP1. The support units SU1 may extend in the first direction DR1 and may be arranged in the second direction DR2. The support units SU1 may extend across the entirety of the bending area BA or a portion of the bending area BA.

The support units SU1 may be disposed on the dummy film DF1 as a single layer in the opening portion OP1 and may contact each other. Each of the support units SU1 may have a thickness smaller than that of the protection film PF1. Therefore, a space may be provided in the opening portion OP1 on and/or around the support units SU1.

Since the support units SU1 are disposed in the bending area BA, the bending area BA may be further strengthened. Therefore, the bending area BA may be further prevented from being damaged due to an external impact.

Figure 8:
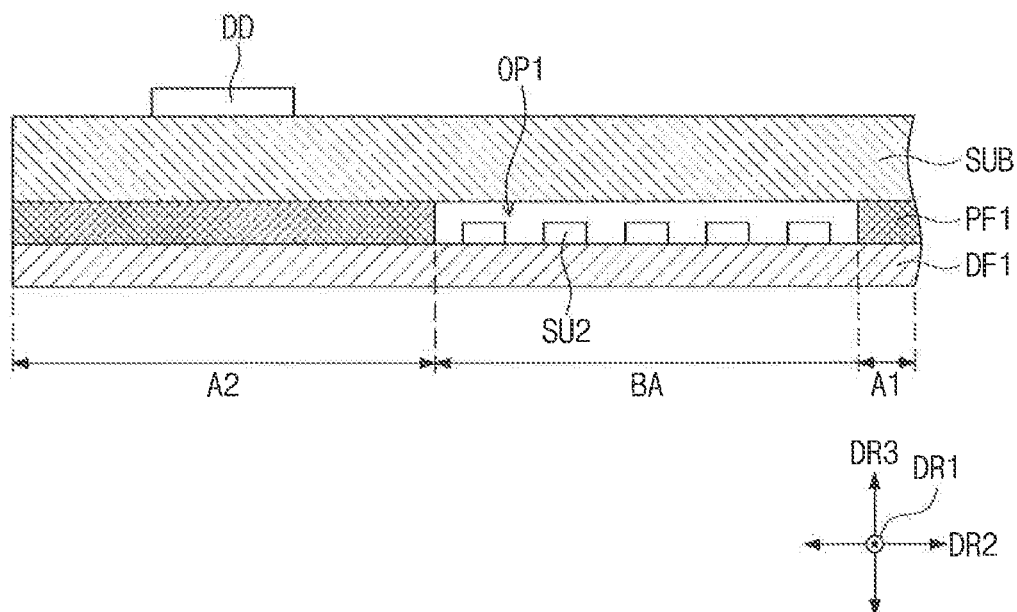

Referring to FIG. 8, the opening portion OP1 may be located in the bending area BA, and a plurality of support units SU2 may be disposed on a portion of the dummy film DF1 overlapping the opening portion OP. Unlike the support units SU1 shown in FIG. 6, the support units SU2 shown in FIG. 8 may be spaced apart from each other.

The support units SU2 may extend in the first direction DR1 and may be arranged in the second direction DR2 like the support units SU1 shown in FIG. 7. The support units SU2 may be disposed as a single layer, and each of the support units SU2 may have a thickness smaller than that of the protection film PF1. Since the support units SU2 are disposed in the bending area BA, the bending area BA may be further strengthened. Therefore, the bending area BA may be further prevented from being damaged due to an external impact.

Figure 9:
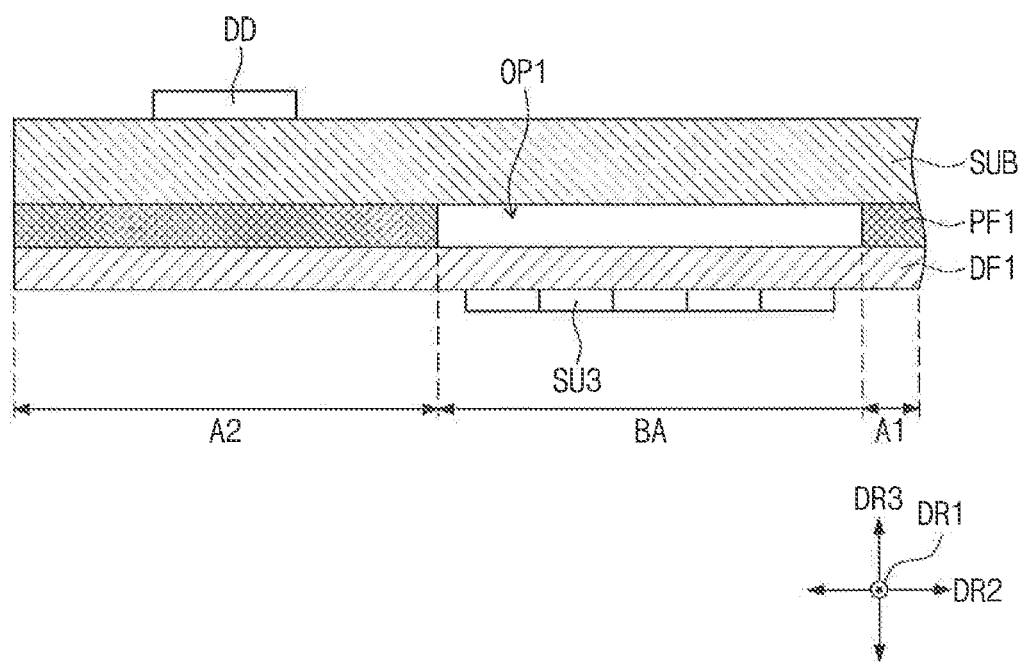

Referring to FIG. 9, a plurality of support units SU3 may be disposed under a portion of the dummy film DF1 overlapping the opening portion OP1 of the bending area BA. The support units SU3 shown in FIG. 9 may have the same structure as that of the support units SU1 shown in FIG. 6. Since the support units SU3 are disposed in the bending area BA, the bending area BA may be further strengthened. Therefore, the bending area BA may be further prevented from being damaged due to an external impact.

Figure 10:
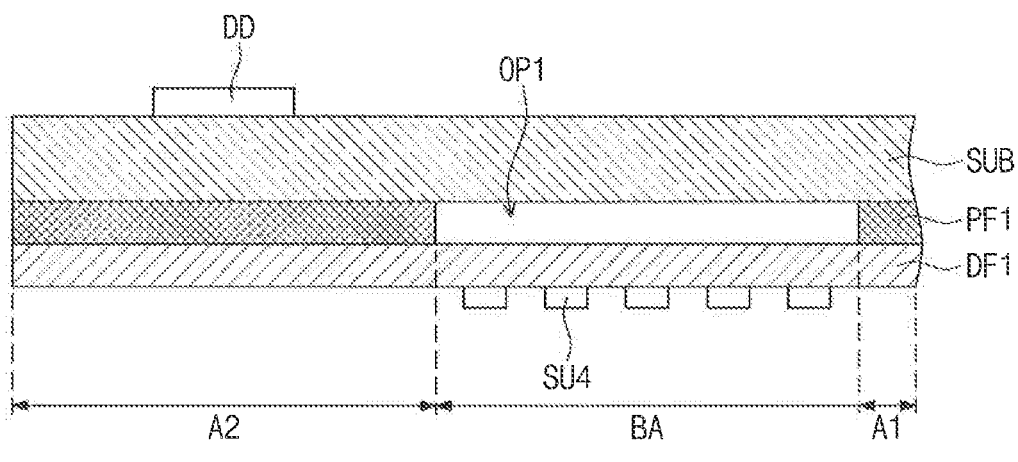
Figure 10:
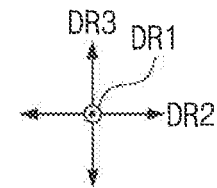

Referring to FIG. 10, a plurality of support units SU4 may be disposed under a portion of the dummy film DF1 overlapping the opening portion OP1 of the bending area BA. The support units SU4 shown in FIG. 10 may have the same structure as that of the support units SU2 shown in FIG. 8 except for their location. Since the support units SU4 are disposed in the bending area BA, the bending area BA may be further strengthened. Therefore, the bending area BA may be further prevented from being damaged due to an external impact.

Figure 11:
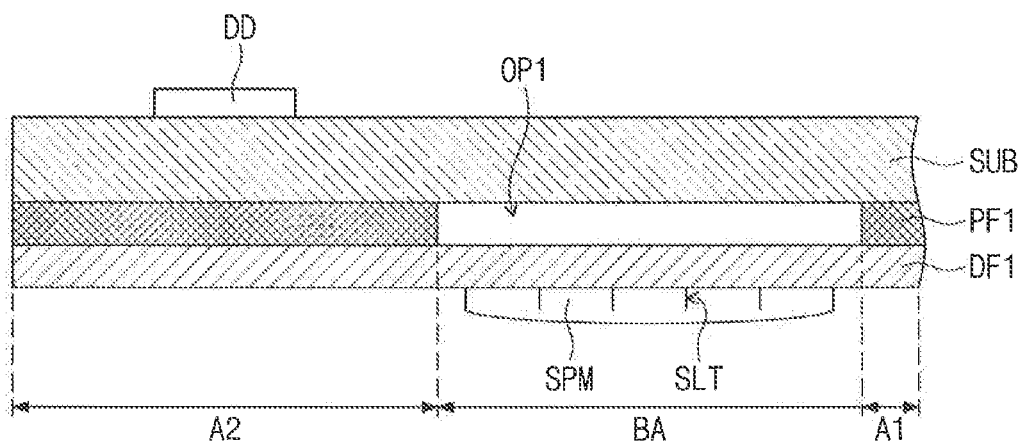
Figure 11:
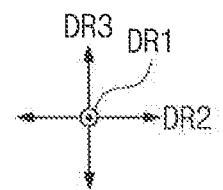

Referring to FIG. 11, a support member SPM may be disposed under a portion of the dummy film DF1 overlapping the opening portion OP1 of the bending area BA. An upper surface of the support member SPM may have a flat shape. In other words, the surface of the support member SPM contacting the dummy film DF1 may be flat. A lower surface of the support member SPM, which is opposite to the upper surface of the support member SPM, may have a convex curved surface. For example, the convex curved surface of support member SPM may be projected downward away from the upper surface of the support member SPM. Since the support member SPM is disposed in the bending area BA, the bending area BA may be further strengthened. Therefore, the bending area BA may be further prevented from being damaged due to an external impact.

A plurality of slits SLT may be formed in the upper surface of the support member SPM. The slits SLT may be formed by half cutting the support member SPM. When the slits SLT are not provided in the support member SPM, the bending of the support member SPM may not be as easily performed. This is so, because the slits SLT can relieve a stress that may be generated in the support member SPM when the bending area BA is bent.

For example, when the bending area BA is bent to allow the second area A2 to be disposed under the first area A1, the slits SLT of the support member SPM may be slightly opened. Therefore, the bending of the support member SPM may be more easily performed.

Figure 12:
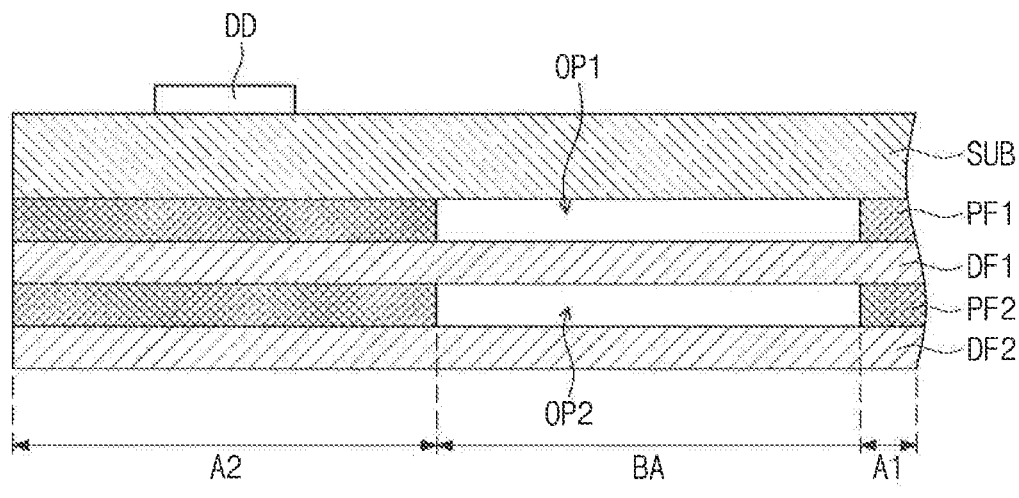
Figure 12:
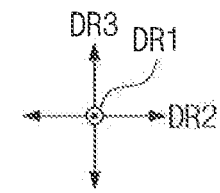

Referring to FIG. 12, the dummy film DF1 may be disposed under the protection film PF1, and the opening portion OP1 may be located in the portion of the protection film PF1 overlapping the bending area BA. A sub-protection film PF2 may be disposed under the dummy film DF1, and a sub-dummy film DF2 may be disposed under the sub protection film PF2.

A sub-opening portion OP2 may be located in a portion of the sub-protection film PF2 overlapping the bending area BA. The sub-opening portion OP2 may extend in the first direction DR1. The sub-protection film PF2 overlapping the bending area BA may be removed to form the sub-opening portion OP2 in the bending area BA.

The sub-dummy film DF2 may be disposed under the sub-protection film PF2 to cover the sub-opening portion OP2. The sub-opening portion OP2 may have the same shape as that of the opening portion OP1. The sub-protection film PF2 may include the same material as the protection film PF1 and the sub-dummy film DF2 may include the same material as the dummy film DF1. The protection film PF1, the dummy film DF1, the sub-protection film PF2, and the sub-dummy film DF2 may be flexible. The protection film PF1, the dummy film DF1, the sub-protection film PF2, and the sub-dummy film DF2 may have the same thickness.

Since the sub-dummy film DF2 is disposed in the bending area BA and the sub-opening portion OP2 is located in the bending area BA, the bending area BA may be further strengthened. For example, an external impact applied to the bending area BA may be further absorbed, and thus, the bending area BA may be prevented from being damaged due to the external impact.

Figure 13:
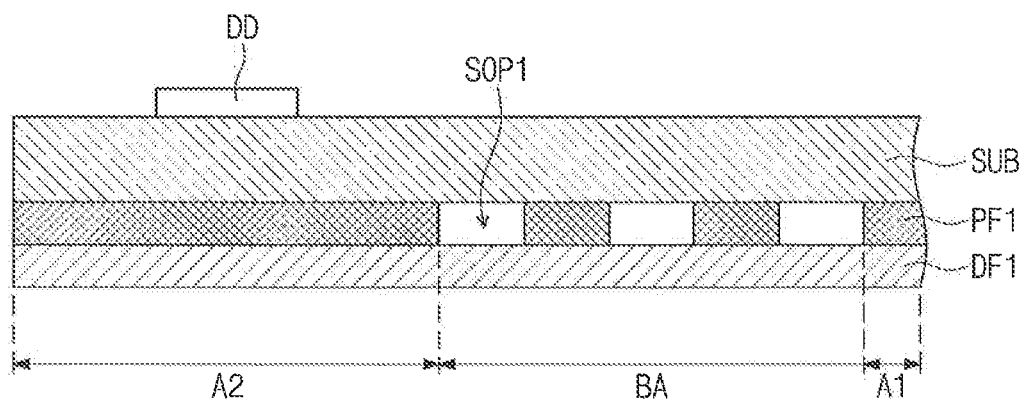
Figure 13:
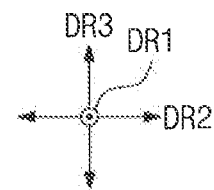

Referring to FIG. 13, the protection film PF1 may be disposed under the substrate SUB, and the dummy film DF may be disposed under the protection film PF1. A plurality of first sub-opening portions SOP1 may be located between predetermined portions of the protection film PF1 overlapping the bending area BA.

The protection film PF1 overlapping the bending area BA may be removed from a plurality of areas in the bending area BA to form the first sub-opening portions SOP1. The first sub-opening portions SOP1 may extend in the first direction DR1. The bending area BA shown in FIG. 13 may have the same structure as that of the bending area BA shown in FIG. 4 except that the first sub-opening portions SOP1 are provided in the bending area BA.

Figure 14:
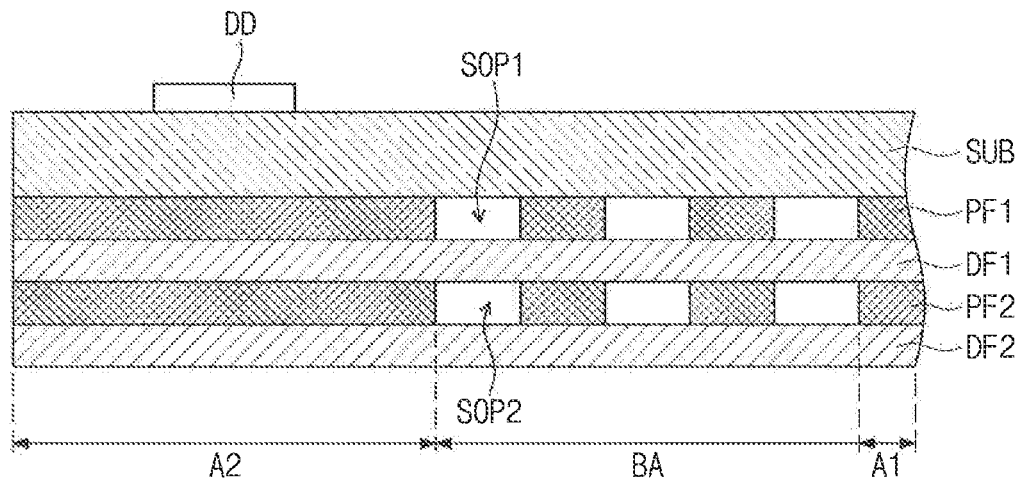
Figure 14:
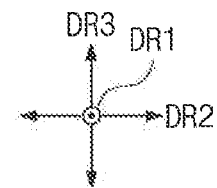

Referring to FIG. 14, the protection film PF1 and the dummy film DF1 may be disposed under the substrate SUB, and the plurality of first sub-opening portions SOP1 may be located between predetermined portions of the protection film PF1 overlapping the bending area BA as shown in FIG. 13.

The sub-protection film PF2 may be disposed under the dummy film DF1, and the sub-dummy film DF2 may be disposed under the sub-protection film PF2. A plurality of second sub-opening portions SOP2 may be located between predetermined portions of the sub-protection film PF2 overlapping the bending area BA in the sub protection film PF2.

The sub-protection film PF2 overlapping the bending area BA may be removed from a plurality of areas in the bending area BA to form the second sub-opening portions SOP2. The second sub-opening portions SOP2 may extend in the first direction DR1 and may overlap with the first sub-opening portions SOP1. For example, the first sub-opening portions SOP1 and the second sub-opening portions SOP2 may coincide with each other in the third direction DR3.

The bending area BA shown in FIG. 14 may have the same structure as that of the bending area BA shown in FIG. 12 except that the first and second sub-opening portions SOP1 and SOP2 are provided in the bending area BA.

Figure 15:
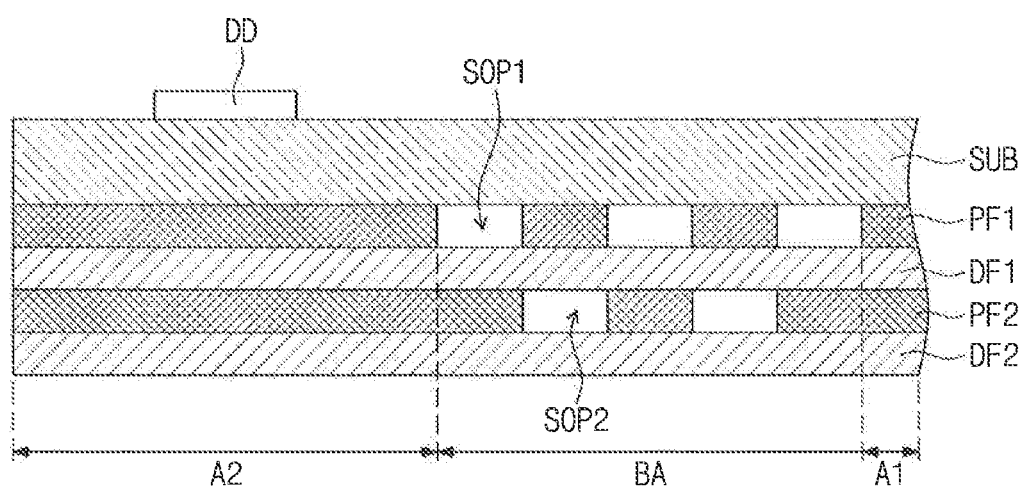
Figure 15:
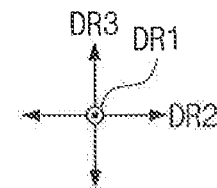

Referring to FIG. 15, the protection film PF1, the dummy film DF1, the sub-protection film PF2, and the sub-dummy film DF2 may be sequentially disposed under the substrate SUB. The plurality of first sub-opening portions SOP may be formed in predetermined areas between the protection film PF1 overlapping the bending area BA, and the plurality of second sub-opening portions SOP2 may be formed in predetermined areas between the sub-protection film PF2 overlapping the bending area BA. The second sub-opening portions SOP2 may not overlap with the first sub-opening portions SOP1. In other words, the second sub-opening portions SOP2 may not coincide with the first sub-opening portions SOP1 in the third direction.

The bending area BA shown in FIG. 15 may have the same structure as that of the bending area BA shown in FIG. 14 except that the first and second sub-opening portions SOP1 and SOP2 do not overlap with each other.

Figure 16:
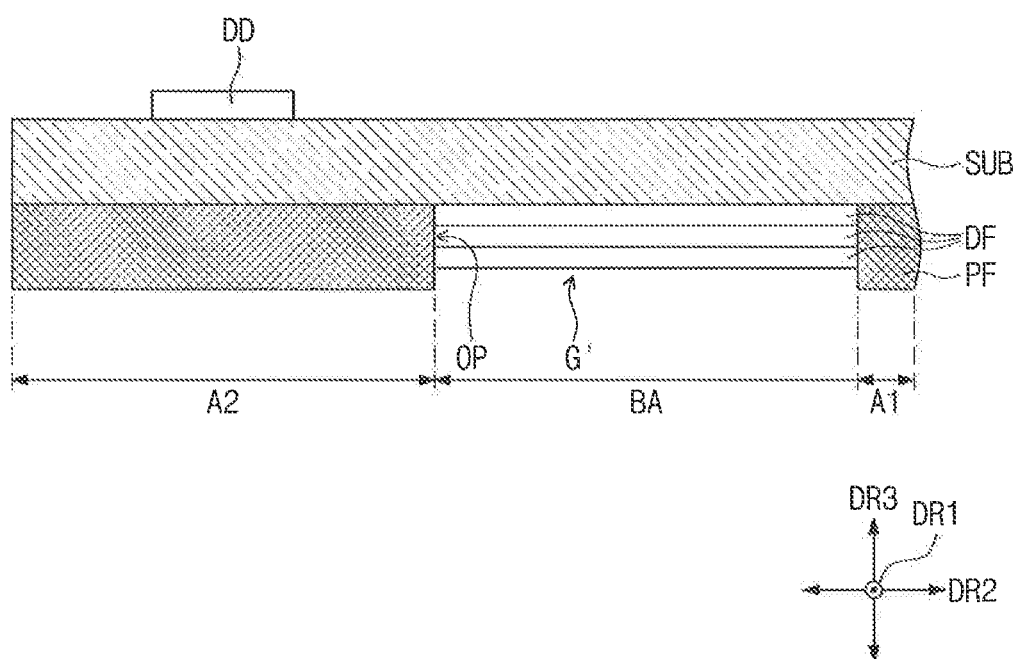

Referring to FIG. 16, a protection film PF may be disposed under the substrate SUB. The protection film PF may have flexibility, and the protection film PF may have a thickness of about 100 micrometers (μm). An opening portion OP may be provided in a portion of the protection film PF overlapping the bending area BA. The protection film PF overlapping the bending area BA may be removed to form the opening portion OP.

A plurality of dummy films DF may be disposed under a portion of the substrate SUB overlapping the opening portion OP. A total thickness of the dummy films DF, which is a sum of thicknesses of all the dummy films DF, may be smaller than a thickness of the protection film PF. The thickness of each of the dummy films DF may range from about 20 (μm) micrometers to about 30 micrometers (μm). FIG. 16 shows three dummy films DF as a representative example, however, the number of the dummy films DF is not limited thereto as long as the total thickness of the dummy films DF is smaller than the thickness of the protection film PF.

Each of the dummy films DF may be flexible and may include the same material as the protection film PF. However, the inventive concept is not limited thereto, and the dummy films DF may include different material from the protection film PF.

Since the total thickness of the dummy films DF is smaller than that of the protection film PF, a groove G' may be formed in the bending area BA. In addition, the thickness of the bending area BA is smaller than its periphery. Therefore, the bending area BA may be easily bent. Further, when the dummy films DF are disposed in the bending area BA, the bending area BA may be strengthened, and as a result, a resistance of the bending area BA to an external impact may increase.

Although the inventive concept has been shown and described with reference to exemplary embodiments thereof, it is understood by one of ordinary skill in the art that various changes in form and detail can be made thereto without departing from the spirit and scope of the inventive concept as hereinafter claimed.

What is claimed is:
1. A display apparatus, comprising:
 a substrate comprising a first area, a second area, and a folding area between the first area and the second area;
 a first protection member disposed under the substrate and having a plurality of first openings overlapping the folding area;
 a second protection member disposed under the first protection member and having at least one second opening overlapping the folding area;
 a cover member disposed between the first protection member and the second protection member and covering the plurality of first openings,
 wherein the first openings are sealed by the substrate and the cover member.
2. The display apparatus of claim 1, wherein the first protection member has a different thickness than the cover member.
3. The display apparatus of claim 2, wherein the first protection member has a larger thickness than the cover member.
4. The display apparatus of claim 1, wherein the substrate has a thickness smaller than a thickness of the first protection member.
5. The display apparatus of claim 1, wherein each of the substrate, the first protection member, and the cover member is flexible, and the substrate and the cover member are folded and unfolded in the folding area.
6. The display apparatus of claim 5, wherein the second area is disposed under the first area when the folding area is folded.
7. The display apparatus of claim 1, further comprising a plurality of pixels disposed on the first area,
 wherein the first area comprises: a display area in which the pixels are disposed; and
 a non-display area adjacent to the display area.
8. The display apparatus of claim 7, further comprising:
 a thin film encapsulation layer disposed in the display area and a portion of the non-display area to cover the pixels;

a touch sensing unit disposed on the thin film encapsulation layer; and a window disposed on the touch sensing unit.

9. The display apparatus of claim 7, further comprising:

a scan driver disposed in the non-display area and connected to the pixels through a plurality of scan lines;

an emission driver disposed in the non-display area and connected to the pixels through a plurality of emission lines; and a data driver disposed in the second area and connected to the pixels through a plurality of data lines.

10. The display apparatus of claim 1, wherein the folding area extends in a first direction, and the first area, the second area, and the folding area are arranged in a second direction crossing the first direction.

11. The display apparatus of claim 1, further comprising a plurality of support units disposed on a portion of the cover member overlapping the folding area.

12. The display apparatus of claim 11, wherein each of the support units has a thickness smaller than a thickness of the first protection member.

13. The display apparatus of claim 11, wherein the support units are disposed on the cover member in a single layer and contact each other.

14. The display apparatus of claim 11, wherein the support units are disposed on the cover member in a single layer and are spaced apart from each other.

15. The display apparatus of claim 1, further comprising a plurality of support units disposed under a portion of the dummy film overlapping the folding area.

16. The display apparatus of claim 1, further comprising a support member disposed under a portion of the cover member overlapping the folding area.

17. The display apparatus of claim 16, wherein a plurality of slits is provided in an upper surface of the support member, and a lower surface of the support member has a convex curved surface projected away from the upper surface of the support member.

18. The display apparatus of claim 1, further comprising:

a sub-cover member disposed under the second protection member.

19. A display apparatus, comprising:

a substrate including a first area, a second area, and a bending area between the first area and the second area;

a protection member disposed under the substrate and having at least one opening over lapping the bending area;

a support member disposed under the substrate and having a plurality of slits overlapping the bending area; and a cover member disposed the protection member and the support member and covering the plurality of slits, wherein the plurality of slits are provided in an upper surface of the support member and not provided in a lower surface of the support member.

20. The display apparatus of claim 19, wherein the lower surface of the support member has a convex curved surface projected away from the upper surface of the support member.

21. A display apparatus, comprising:

a substrate comprising a first area, a second area, and a folding area between the first area and the second area;

a first protection member disposed under the substrate and having a plurality of first openings overlapping the folding area;

a second protection member disposed under the first protection member and having at least one second opening overlapping the folding area;

a cover member disposed between the first protection member and the second protection member and covering the plurality of first openings, wherein the first openings are fully covered by the substrate and the cover member.

* * * * *